(12) United States Patent
Bohn et al.

(10) Patent No.: US 11,823,864 B1
(45) Date of Patent: Nov. 21, 2023

(54) EMBEDDED HIGH-Z MARKER MATERIAL AND PROCESS FOR ALIGNMENT OF MULTILEVEL EBEAM LITHOGRAPHY

(71) Applicant: HRL LABORATORIES, LLC, Malibu, CA (US)

(72) Inventors: Christopher Bohn, Santa Monica, CA (US); Maxwell Choi, Thousand Oaks, CA (US); Melanie Yajima, Los Angeles, CA (US); Sieu Ha, Los Angeles, CA (US); Maggy Lau, Stevenson, CA (US); Clayton Jackson, Los Angeles, CA (US); Wonill Ha, Thousand Oaks, CA (US); Matthew Borselli, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 393 days.

(21) Appl. No.: 17/121,109

(22) Filed: Dec. 14, 2020

Related U.S. Application Data

(60) Provisional application No. 63/007,104, filed on Apr. 8, 2020.

(51) Int. Cl.
*H01J 37/317* (2006.01)
*G03F 9/00* (2006.01)
(Continued)

(52) U.S. Cl.
CPC .......... *H01J 37/3177* (2013.01); *G03F 9/708* (2013.01); *G03F 9/7076* (2013.01);
(Continued)

(58) Field of Classification Search
CPC ......... H01J 37/3177; H01J 2237/24475; H01J 2237/334; G03F 9/7076; G03F 9/708;
(Continued)

(56) References Cited

U.S. PATENT DOCUMENTS

| 5,869,383 A * | 2/1999 | Chien ................... H01L 23/544 |
| | | 257/E23.179 |
| 6,420,703 B1 * | 7/2002 | Wu ...................... H01J 37/3056 |
| | | 977/869 |

(Continued)

FOREIGN PATENT DOCUMENTS

| TW | 201703193 A * | 1/2017 | ......... H01L 21/0274 |

*Primary Examiner* — John P. Dulka
(74) *Attorney, Agent, or Firm* — Lewis Roca Rothgerber Christie LLP

(57) ABSTRACT

One or more embodiments of the present disclosure are directed toward improved methods of fabricating a semiconductor device utilizing multi-level electron beam lithography (e-beam lithography), an alignment marker for multi-level e-beam lithography, and a semiconductor device including the alignment marker. A method of fabricating a semiconductor device may include: forming an alignment marker in a substrate, the alignment marker including tantalum; determining, utilizing a backscatter electron detector of an electron beam lithography tool, a location of an edge of the alignment marker based on an atomic number contrast between the alignment marker and the substrate; and forming, utilizing the electron beam lithography tool, at least one transistor in the substrate based on the location of the edge of the alignment marker.

14 Claims, 12 Drawing Sheets

(51) Int. Cl.
*H01L 21/033* (2006.01)
*H01L 23/544* (2006.01)

(52) U.S. Cl.
CPC ........ *G03F 9/7088* (2013.01); *H01L 21/0332* (2013.01); *H01L 21/0337* (2013.01); *H01L 23/544* (2013.01); *H01J 2237/24475* (2013.01); *H01J 2237/334* (2013.01); *H01L 2223/54426* (2013.01)

(58) Field of Classification Search
CPC ............... G03F 9/7088; H01L 21/0332; H01L 21/0337; H01L 23/544; H01L 2223/54426
See application file for complete search history.

(56) References Cited

U.S. PATENT DOCUMENTS

| | | | | | |
|---|---|---|---|---|---|
| 2002/0004283 | A1* | 1/2002 | Boulin | ................ | H01J 37/3045 |
| | | | | | 257/E23.179 |
| 2005/0266357 | A1* | 12/2005 | Baer | ....................... | G03F 9/708 |
| | | | | | 430/324 |
| 2005/0282396 | A1* | 12/2005 | Lin | ....................... | H01L 23/544 |
| | | | | | 257/E23.179 |
| 2008/0157260 | A1* | 7/2008 | Fried | ..................... | B82Y 40/00 |
| | | | | | 257/E23.179 |
| 2009/0032978 | A1* | 2/2009 | Bucchignano | ........ | G03F 9/7076 |
| | | | | | 257/E23.179 |
| 2009/0045530 | A1* | 2/2009 | Bucchignano | .......... | H01L 24/11 |
| | | | | | 257/E23.179 |
| 2011/0294278 | A1* | 12/2011 | Eguchi | .............. | H01L 29/66727 |
| | | | | | 257/E21.53 |
| 2013/0221365 | A1* | 8/2013 | Duval | .................... | G03F 9/708 |
| | | | | | 257/E29.09 |
| 2013/0277756 | A1* | 10/2013 | Kawano | ................ | H01L 23/544 |
| | | | | | 257/384 |
| 2017/0045475 | A1* | 2/2017 | Astier | ................ | B81C 1/00063 |

\* cited by examiner

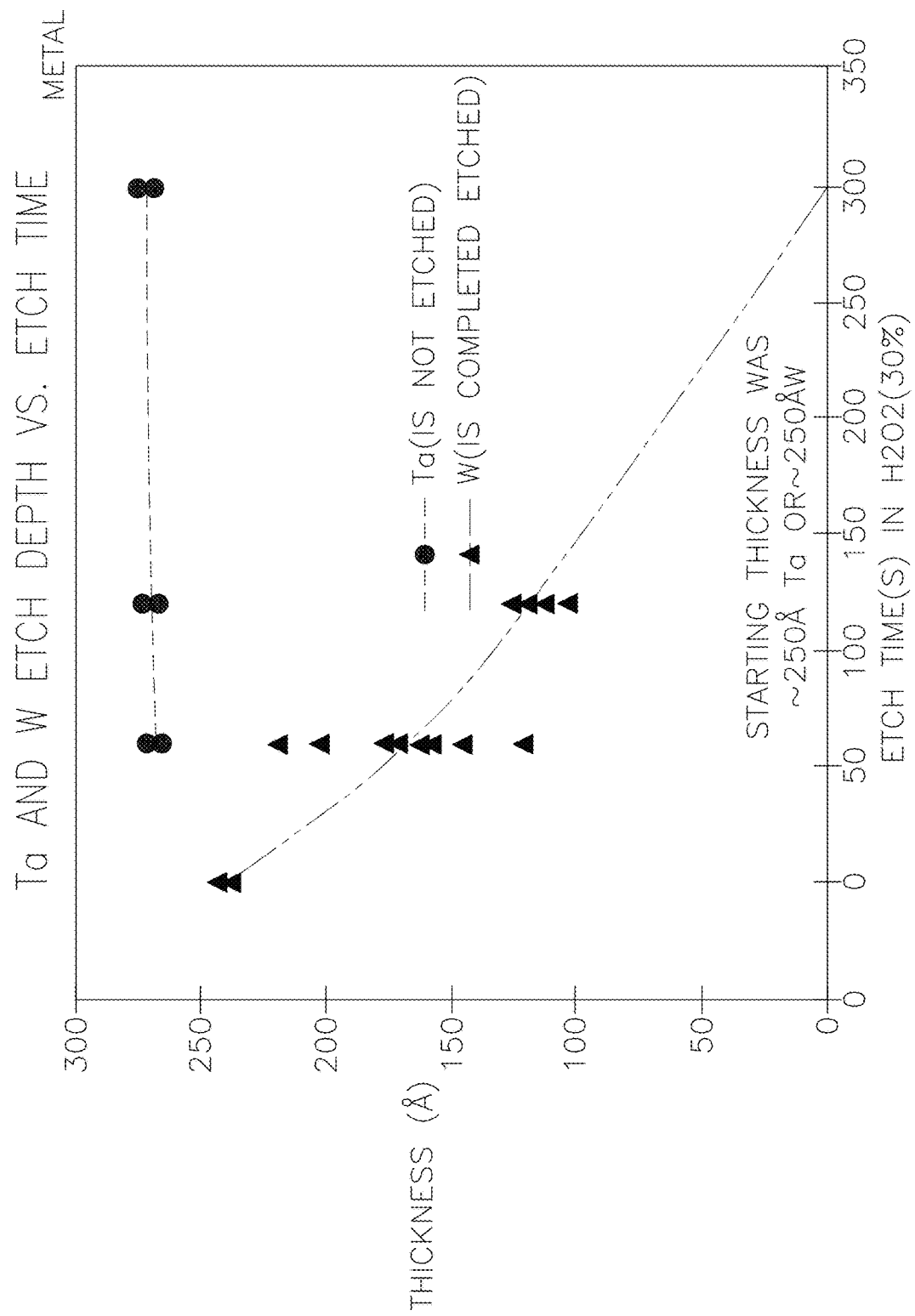

EMBEDDED HIGH-Z MARKER MATERIAL AND PROCESS FOR ALIGNMENT OF MULTILEVEL EBEAM LITHOGRAPHY

CROSS-REFERENCE TO RELATED APPLICATION(S)

The present application claims priority to and the benefit of U.S. Provisional Application No. 63/007,104, filed Apr. 8, 2020, the entire content of which is incorporated herein by reference.

STATEMENT REGARDING FEDERALLY SPONSORED RESEARCH OR DEVELOPMENT

This invention was made with U.S. Government support. The U.S. Government has certain rights to this invention.

BACKGROUND

1. Field

Aspects of embodiments of the present disclosure relate generally to methods of fabricating a semiconductor device utilizing multi-level electron beam lithography (e-beam lithography), an alignment marker for multi-level e-beam lithography, and a semiconductor device including the alignment marker.

2. Description of Related Art

During recent years, e-beam lithography has become a commonly used tool for manufacturing integrated circuits. E-beam lithography utilizes a focused beam of electrons to draw custom shapes and patterns on a surface of a material that is covered with an electron-sensitive resist. This step is called exposing. Then, during the step of developing, the regions of the resist that were exposed to the beam of electrons are selectively removed (while the non-exposed regions are maintained) or maintained (while the non-exposed regions are removed). One of the primary benefits of e-beam lithography is its ability to draw nano-scale patterns. For example, modern semiconductor structures, such as, for example, metal-oxide-semiconductor field-effect transistor (MOSFET), can be manufactured to a size of less than 10 nm. However, at such a small scale, misalignment between multiple layers of the manufactured device can be detrimental to the proper function of the device. Therefore, it is important to maintain accurate alignment between the patterns of the multi-layer structure of the integrated circuit.

One way to maintain proper alignment between multiple layers of the integrated circuit structure, is to use alignment markers. The e-beam lithography tool may then locate these markers on an underlying layer, and properly (or suitably) align a subsequent layer to correspond to the pattern on the underlying layer. Related art alignment markers are typically formed of tungsten (W).

SUMMARY

The present application relates to various methods of fabricating a semiconductor device. In one embodiment, the method includes forming an alignment marker including tantalum in a substrate, determining, utilizing a backscatter electron detector of an electron beam lithography tool, a location of an edge of the alignment marker based on an atomic number contrast between the alignment marker and the substrate, and forming, utilizing the electron beam lithography tool, at least one transistor in the substrate based on the location of the edge of the alignment marker.

The edge of the alignment marker may have a line edge roughness of about 2.5 nm or less.

The alignment marker may have a line edge roughness in a range from about 0.75 nm to about 2.25 nm.

The method may also include wet etching the substrate. The alignment marker may be substantially not etched during the wet etching of the substrate.

Wet etching of the substrate may utilize $H_2O_2$.

Forming the alignment marker may include forming a trench in the substrate, depositing an alignment marker material comprising metal tantalum (Ta) in the trench, and patterning the deposited alignment marker material to form the alignment marker. A height of the alignment marker in a thickness direction of the substrate may be less than or equal to a depth of the trench in the thickness direction of the substrate.

Patterning the deposited alignment marker material may include dry etching the deposited alignment marker material utilizing a fluorinated plasma and a mask, and the deposited alignment marker material may have a selectivity to the mask in the fluorinated plasma of greater than about 16:1.

The fluorinated plasma may be $CF_4$, and the mask may be a hafnium oxide ($HfO_2$) mask.

The method may also include determining a centroid of the alignment marker based on the location of the edge of the alignment marker. Forming, utilizing the electron beam lithography tool, of the at least one transistor in the substrate may be further based on the centroid of the alignment marker.

During the depositing of the alignment marker material, a reaction between the alignment marker material and a material of the substrate may exhibit a negative enthalpy of formation.

The material of the substrate may be oxide, nitride, or carbide.

The method may also include performing one or more back-end-of-line processes on the substrate, and the performing of the one or more back-end-of-line processes may include forming at least one metal interconnect and/or at least one via based on the location of the edge of the alignment marker.

The present disclosure also relates to various embodiments of a semiconductor device. In one embodiment, the semiconductor device includes a substrate, an alignment marker including tantalum (Ta) embedded in the substrate, a series of transistors in the substrate, and a series of metal interconnects and metal vias connected to the series of transistors.

The alignment marker may have a line edge roughness of less than about 2.5 nm.

The alignment marker may have a line edge roughness in a range from about 0.75 nm to about 2.25 nm.

The alignment marker may have a square shape, and a line edge roughness of each side of the square shape may be less than about 2.5 nm.

The alignment marker may be in a trench in the substrate, and a height of the alignment marker in a thickness direction of the substrate may be less than or equal to a depth of the trench in a thickness direction of the substrate.

In one embodiment, a method of forming an alignment marker in a substrate includes forming a trench in the substrate, depositing an alignment marker material including metal tantalum (Ta) in the trench, and patterning the deposited alignment marker material to form the alignment marker. A height of the alignment marker in a thickness direction of the substrate is less than or equal to a depth of the trench in the thickness direction of the substrate.

Patterning the deposited alignment marker material may include dry etching the deposited alignment marker material utilizing $CF_4$ and a hafnium oxide ($HfO_2$) mask, and the deposited alignment marker material may have a selectivity to the $HfO_2$ mask in a $CF_4$ plasma of greater than about 16:1.

The alignment marker may have a line edge roughness of less than about 2.5 nm.

The substrate may include an oxide, nitride, or carbide material, and, during the depositing of the alignment marker material in the trench of the substrate, a reaction between the alignment marker material and the material of the substrate may exhibit a negative enthalpy of formation.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIG. 8A is a graph showing thickness change over time of a Ta sample and a W sample in (30%) $H_2O_2$.

DETAILED DESCRIPTION

The present disclosure relates to various embodiments of a method of fabricating a semiconductor device including forming a tantalum alignment marker in a substrate, detecting a location of the tantalum alignment marker utilizing an electron backscatter detector, and forming at least one transistor device and/or one or more other front-end-of-line or back-end-of-line features (e.g., gates, sources and drains, metal interconnects, and/or vias) based on the location of the tantalum alignment marker, utilizing an electron beam lithography tool. The present disclosure also relates to various embodiments of a semiconductor device including a tantalum alignment marker. Utilizing tantalum for the alignment marker is configured or adapted to reduce a line edge roughness of the alignment marker (e.g., the tantalum alignment marker of the present embodiments may have a line edge roughness of about 2.5 nm or less), which improves the positional accuracy of the at least one transistor device and/or the one or more other front-end-of-line or back-end-of-line features (e.g., gates, sources and drains, metal interconnects, and/or vias) placed based on the position of the tantalum alignment marker. Additionally, the tantalum alignment markers exhibit resistance to wet etchings in acidic and basic solutions that are commonly performed during fabrication of the semiconductor device. Furthermore, tantalum alignment markers exhibit a higher etch rate than related art tungsten alignment markers by a conventional dry etching process, and therefore tantalum alignment markers exhibit higher selectivity to a variety of etch masks than related art tungsten alignment markers. Moreover, tantalum exhibits a highly negative enthalpy of formation during deposition of the tantalum in the substrate, which results in strong adhesion between the tantalum alignment marker and the substrate.

Figure 1:
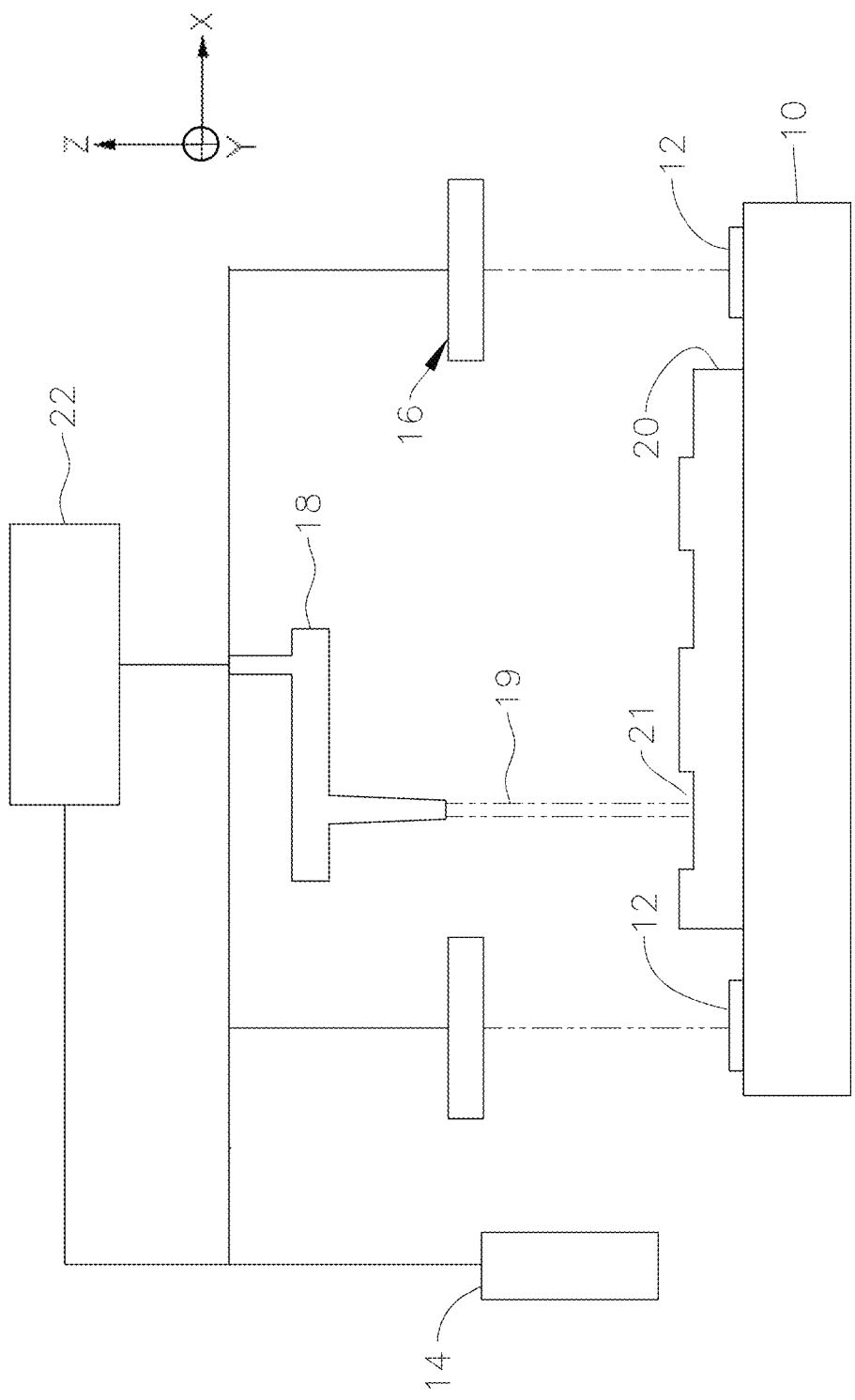
FIG. 1 is a schematic view of a portion of an e-beam lithography tool being utilized to form patterns on a substrate according to one or more embodiments of the present disclosure.

As shown in FIG. 1, a substrate 10 may include alignment markers 12 positioned on the substrate. During the manufacturing process, marker detection equipment 14 can determine the position of the alignment markers 12 using one or more sensors 16. The marker detection equipment 14 is included in the e-beam lithography tool. Any suitable marker detection equipment capable of detecting a given alignment marker may be utilized, without limitation.

A layer 20 may be positioned on the substrate 10 and patterned with a pattern 21 using a patterning tool 18 that shoots a focused electron beam 19. One or more layers 20 may include a plurality of transistors. One or more layers 20 may include a plurality of metal interconnects and/or metal vias connected to the plurality of transistors. The position of the focused electron beam 19 may be determined using one or more alignment markers 12. In particular, the sensors 16 may determine the positions of the alignment markers 12 and ascertain where the pattern 21 shall begin, for example. If alignment (e.g., re-positioning) of the patterning tool 18 is needed, a motor 22 can move the patterning tool 18 based on the data received from the marker detection equipment 14. For example, the motor 22 can move the patterning tool along the X-axis, Y-axis, and/or the Z-axis (i.e., the rotation axis about which rotations are performed), as appropriate.

The substrate 10 may include any suitable number of alignment markers 12 to ensure proper alignment of one or more subsequent layers 20. For example, reference to a single marker 12 or a plurality of markers 12 may be used.

Figure 2:
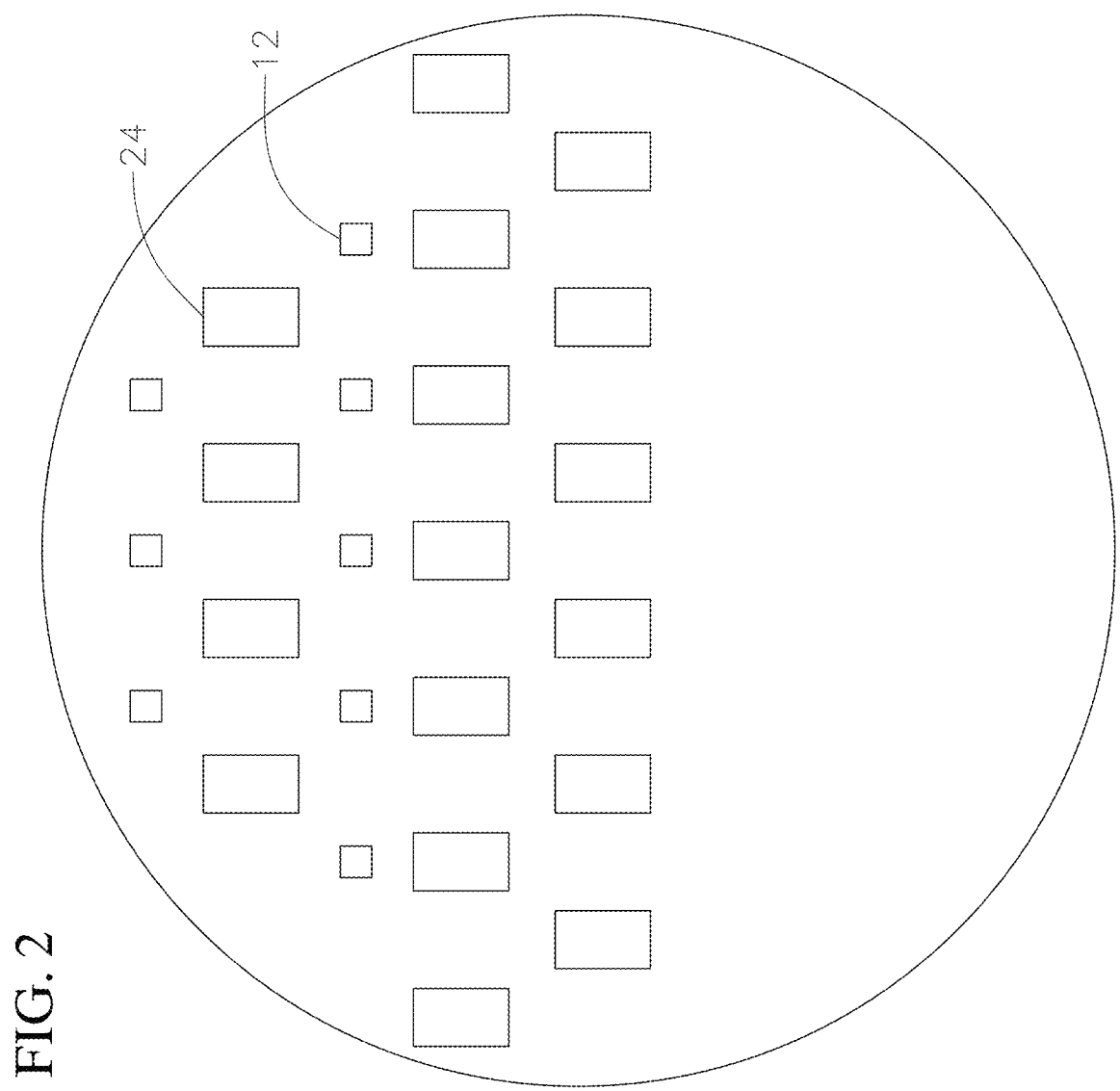
FIG. 2 is a schematic view of a substrate according to one or more embodiments of the present disclosure.

Referring to FIG. 2, alignment markers 12 are usually positioned outside of an active area 24 where a device (e.g., an integrated circuit) is being fabricated. However, embodiments of the present disclosure are not limited thereto, and alignment markers 12 can be inside the active area 24.

Figure 3:
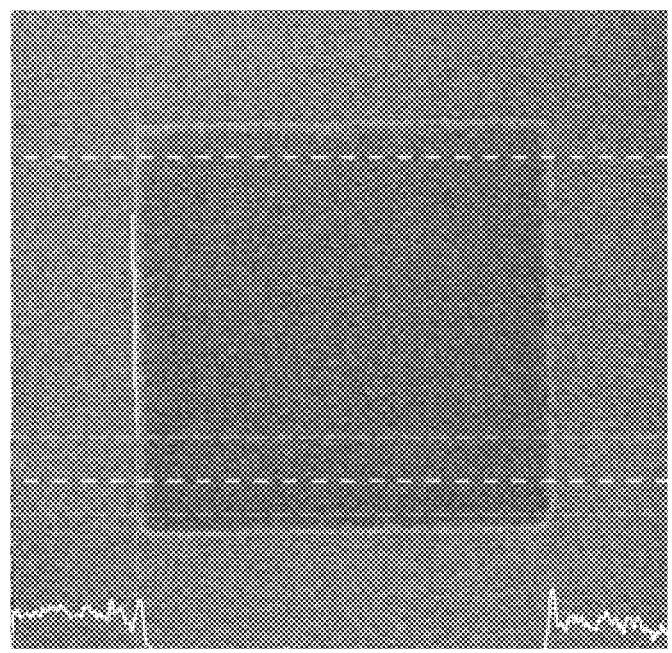
FIG. 3 is an image of an alignment marker according to one or more embodiments of the present disclosure generated using a backscattered electron detector.

A square pattern is illustrated in FIG. 2 as the alignment marker 12, but as one skilled in the art will understand, such markers can come in a variety of different shapes and sizes (e.g., in a cross pattern, a star pattern, a circle pattern, etc.). During the e-beam lithography process, the sensors 16 will locate the center of the alignment marker pattern to determine the position of the alignment marker 12. Accordingly, any suitable pattern of the alignment marker 12 may be used, so long as the center of the marker may be easily found. A size of the alignment marker 12 may range from about 1 µm to about 10 µm. For example, FIG. 3 illustrates a square 4 µm marker, but embodiments of the present disclosure are not limited thereto. In FIG. 3, the marker was imaged with a backscattered electron detector (BSD) at 100 kV.

Figure 4:
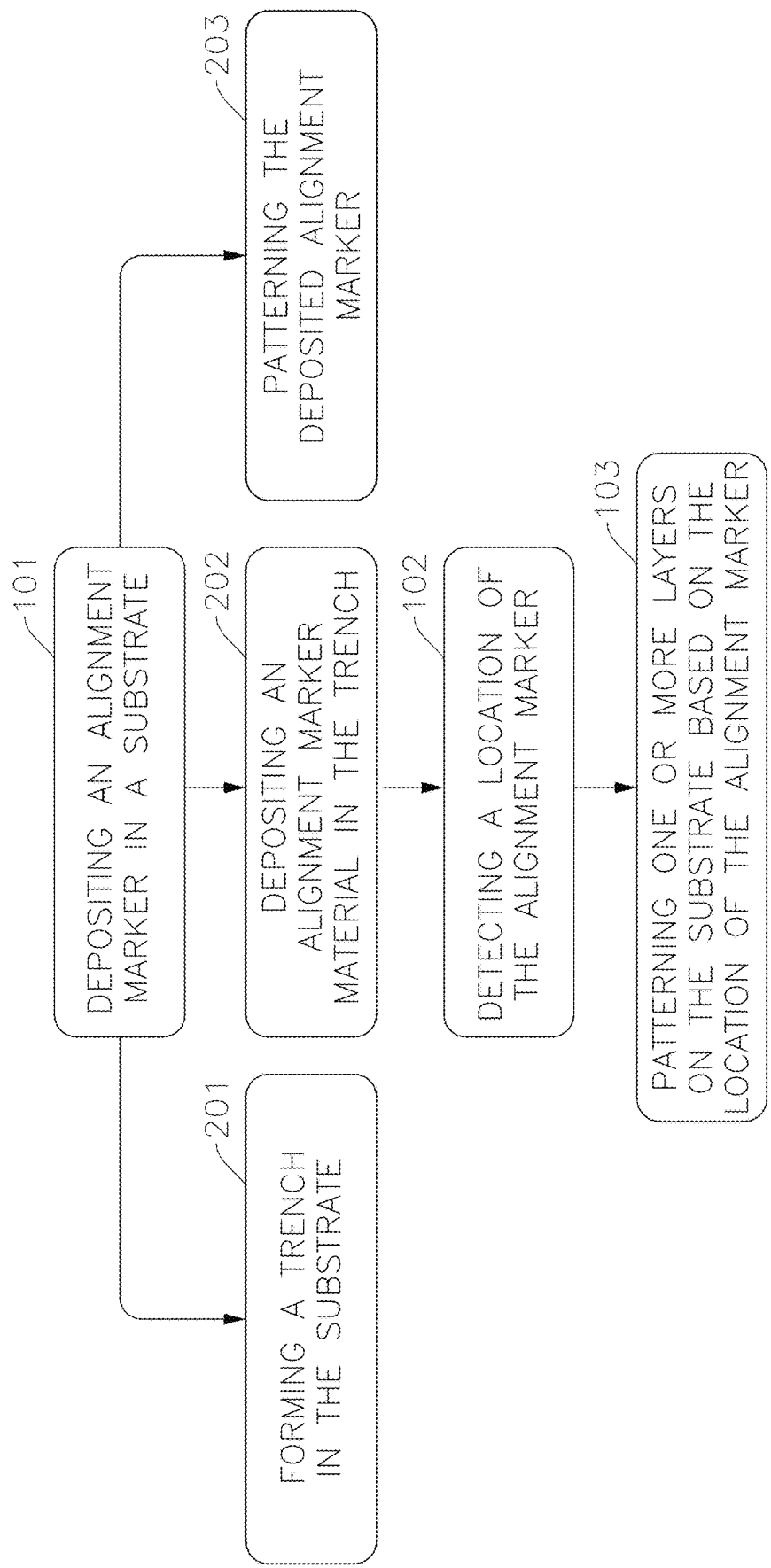
FIG. 4 is a flowchart of a method of fabricating a semiconductor device according to one or more embodiments of the present disclosure.

According to one or more embodiments of the present disclosure, the method (see FIG. 4) may include an act 101 of depositing the alignment marker 12 in a substrate 10, an act 102 of detecting (determining) a location of the alignment marker 12, and an act 103 of patterning one or more layers 20 on the substrate 10 based on the location of the alignment marker 12. In one or more embodiments, the act 102 of detecting (determining) the location of the alignment marker 12 includes detecting (or determining) a location of an edge of the alignment marker 12, utilizing a backscatter electron detector of an electron beam lithography tool, based on an atomic number contrast between the alignment marker 12 and the substrate 10. Additionally, in one or more embodiments, the act 102 includes determining (or calculating) a center (e.g., a centroid) of the alignment marker 12 based on the location of the edge of the alignment marker 12.

Figure 5A:
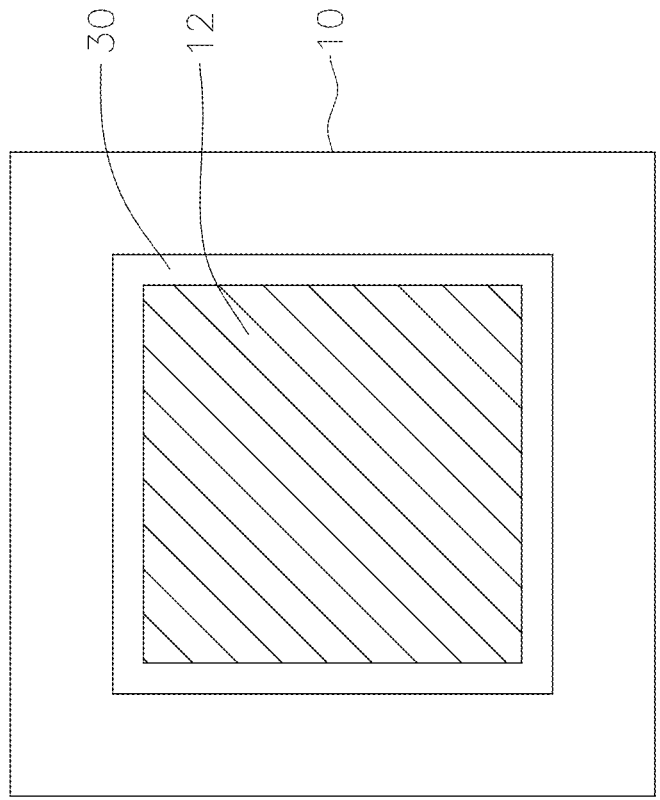
FIG. 5A is a plan schematic view of a trench with a deposited alignment marker material according to one or more embodiments of the present disclosure.
Figure 5B:
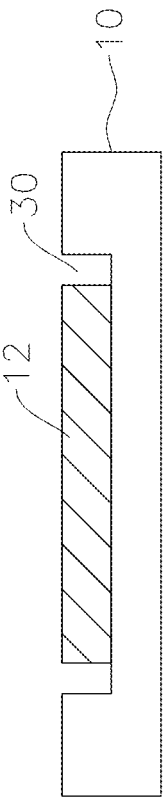
FIG. 5B is a cross-sectional schematic view of the trench with the deposited alignment marker material according to one or more embodiments of the present disclosure.
Figure 5B:
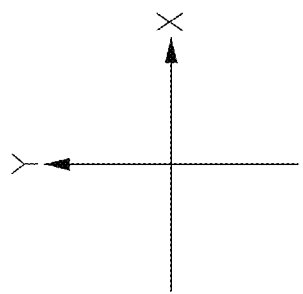
Figure 5B:
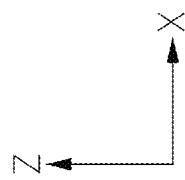

The act 101 of depositing the alignment marker 12 in the substrate may include embedding the alignment marker 12 in the substrate 10. First, in act 201, a trench 30 may be etched in the substrate 10. Referring to FIGS. 5A and 5B, the trench 30 may be etched into the substrate 10 using any suitable etching method. For example, the trench 30 may be etched into the substrate 10 by reactive ion etching (RIE), wet etching, or ion milling, but embodiments of the present disclosure are not limited thereto. A shape of the trench 30 may correspond to the shape of the alignment marker 12. For example, the trench 30 and the alignment marker 12 may both have a square shape, but embodiments of the present disclosure are not limited thereto. A depth of the trench 30 along the Z-axis (in the thickness direction of the substrate) may range from about 50 nm to about 500 nm. However, embodiments of the present disclosure are not limited thereto, and the trench 30 may be of any suitable depth, so long as the alignment marker 12 has sufficient thickness and may be suitably positioned inside the trench 30 and detected by the sensors 16. For instance, in one or more embodiments, the alignment marker 12 may have sufficient thickness such that there is sufficient contrast between the alignment marker 12 and the substrate 10 due to the atomic number difference between the material of the alignment marker 12 (e.g., Ta) and the material of the substrate 10 such that e-beam lithography tool can detect the position of the alignment marker 12. For high atomic number materials, such as tantalum (Ta), the minimum thickness of the alignment marker 12 may be approximately 15 nm.

After the trench 30 is etched, in act 202, the alignment marker 12 is deposited inside the trench 30. The alignment marker 12 may be deposited using any suitable deposition technique, for example, physical vapor deposition (PVD), chemical vapor deposition (CVD), atomic layer deposition (ALD) and/or electro-plating (EP). However, embodiments of the present disclosure are not limited thereto.

Although the present disclosure exemplifies an embodiment in which the alignment marker 12 is embedded in the substrate 10, embodiments of the present disclosure are not limited thereto. For example, the alignment marker 12 may be further embedded in one or more layers 20 that are formed on the substrate 10.

A height of the alignment marker 12 along the Z-axis may be less than or equal to the depth of the trench 30. When the height of the alignment marker 12 does not exceed the depth of the trench 30, the marker 12 does not add topography to the surface of the substrate 10. Maintaining a flat substrate surface is important during front-end-of-line (FEOL) process steps, as topographic uniformity is essential for overcoming the depth-of-focus limitations of the lithography techniques used to pattern nanoscale device structures. Such topographic uniformity may be achieved by, for example, a process step known as chemical-mechanical planarization (CMP). When the alignment marker 12 does not add additional topography to the surface of the substrate 10 (e.g., does not protrude from the surface of the substrate 10), the alignment marker 12 may not be etched or polished away during the CMP step. Accordingly, marker material may be preserved and substantially flat substrate surface may be more effectively maintained.

The alignment marker 12 of the present embodiments may be metallic tantalum (Ta). Ta has atomic number 73. $_{73}$Ta as an alignment marker material has several advantages over a comparable tungsten marker ($_{74}$W marker) of the prior art. These advantages will be explained in more detail herein below.

After the alignment marker 12 is deposited inside the trench 30, in act 203, the marker may be patterned (e.g., etched or by a lift-off process) within the trench area to define the marker. The patterning process performed in act 203 can be done by either optical lithography or e-beam lithography, and the alignment marker 12 can be etched by a dry etch process. Alternatively, the alignment marker 12 can be patterned by a metal lift-off process. The alignment marker 12 may be patterned using any suitable method. For example, the marker 12 may be patterned using a wet etching technique (using liquid chemicals to remove materials from the substrate) or a dry etching technique (using chemically reactive plasma to remove materials from the substrate). The etching may be performed using an organic resist material or an inorganic hard mask.

For tantalum (Ta) marker 12 of the present embodiments, dry etching may be used, and it may be performed with a fluorinated plasma, for example, a $CF_4$ plasma. The Ta marker 12 of the present embodiments is readily etched in $CF_4$ plasma, and thus the Ta marker 12 may be defined with a subtractive etch process (e.g., portions of the alignment marker material may be selectively removed during the etching).

Figure 6:
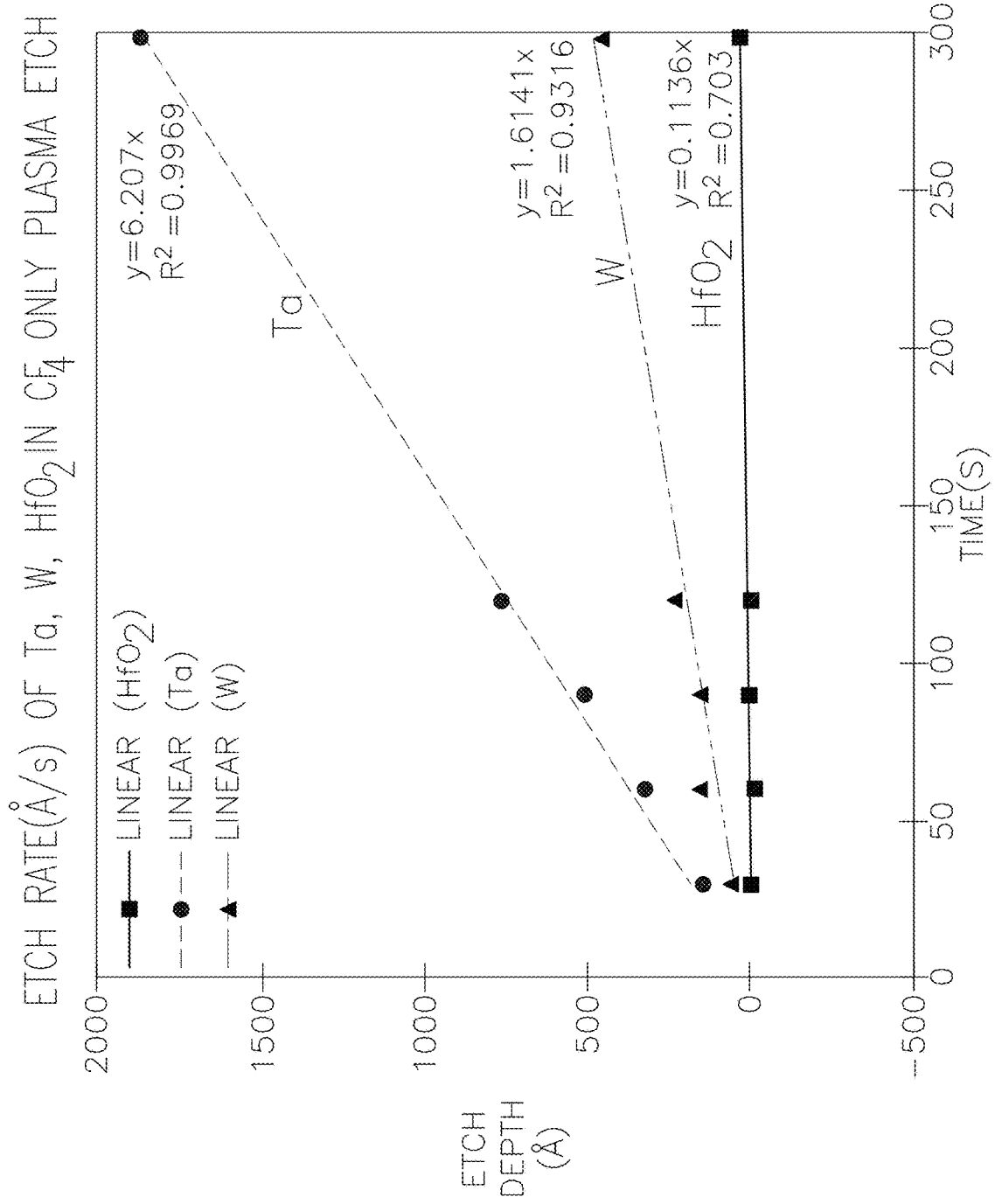
FIG. 6 is a graph showing an etch rate (ER) in Å/sec of tantalum (Ta), tungsten (W), and hafnium oxide ($HfO_2$) in a $CF_4$ only plasma etch.

In some embodiments, the inorganic hard mask may be used for etching of the alignment marker 12, and the inorganic hard mask may be made of, for example, an $HfO_2$ material. However, embodiments of the present disclosure are not limited thereto. For example, silicon oxide or silicon nitride may be used as the hard mask. Compared to related art high-Z (high atomic number) alignment markers, the tantalum ($_{73}$Ta) marker 12 of the present embodiments has improved selectivity to a variety of etch masks. For example, the tantalum ($_{73}$Ta) marker has a significantly higher selectivity to a HfO$_2$ etch mask than a tungsten (74 W) marker. FIG. 6 shows dry etch characteristics for tantalum (Ta), tungsten (W), and hafnium oxide (HfO$_2$) in CF$_4$ only plasma. The results in FIG. 6 have been linearly fit (fit to a line), and corresponding etch rates were calculated from these linear fits. Table 1 shows the calculated etch rates for tantalum (Ta), tungsten (W), and hafnium oxide (HfO$_2$), and corresponding metal:HfO$_2$ selectivity (ratio of the metal etch rate to the HfO$_2$ etch rate):

TABLE 1

| Material | Etch Rate (Å/s) | Selectivity (metal:HfO$_2$) |
|---|---|---|
| Ta | 6.2 | 62 |
| W | 1.6 | 16 |
| HfO$_2$ | 0.1 | 1 |

As can be seen from Table 1, tantalum (Ta) has a selectivity of 62 to HfO$_2$, while tungsten (W) has a selectivity of 16. High selectivity of Ta to HfO$_2$ means that the Ta marker is etched much faster than HfO$_2$, and thus erosion of the HfO$_2$ mask (and thus, the underlying Ta layer) during the etching process may be prevented or significantly reduced. Accordingly, improved definition of the Ta marker may be obtained, as compared with that of the W marker.

In some embodiments, an etch stop layer provided below the alignment market 12 may be used during the patterning of the alignment marker 12. The etch stop layer is configured or adapted to prevent the etch from continuing into the layer(s) of the substrate 10 below the alignment marker 12. The etch stop layer may be used instead of, or in addition to, the hard mask. When both the hard mark and the etch stop layer are used to pattern (define) the Ta marker 12, improved straightness of the sides of the marker may be achieved, and thus the marker may be more accurately detected by the sensors 16 (to be described herein below in more detail). Otherwise, performing the etch without an etch stop layer below the alignment marker 12 may result, for example, in a "double edge" due to the different etch rate and etch profile of the various layers and materials thereof. Accordingly, improved alignment of the layers of the integrated circuit structure may be achieved by utilizing an etch stop and/or a hard mask.

An alignment marker 12 that has been deposited and patterned may be detected on the substrate 10 using sensors 16 of the marker detection equipment 14. In some embodiments, the marker detection equipment 14 may be a backscattered electron detector (BSD). BSD operates by pointing an electron beam at a sample, collecting backscattered electrons (BSE), and using these BSE to produce an image that shows different elements present in a sample. More specifically, when an electron beam strikes a sample, electrons in the beam will interact with a nucleus of each element in the sample (e.g., by elastic scattering interactions), and some of the electrons will have an angle of scattering that allows them to come back out of the sample. These are backscattered electrons that may be detected by the BSD. BSD are usually positioned above the sample (e.g., in a "doughnut" arrangement, with an electron beam at the center of the "doughnut"). As the number of protons in the atomic nucleus increases, the number of BSE increases. Accordingly, when a sample includes a high atomic number (high-Z) material and a low atomic number (low-Z) material, the high-Z material will produce more BSE, while the low-Z material will produce fewer BSE, and the resulting image will reflect this atomic number contrast. Based on this image, an edge of the high-Z material (e.g., a boundary between the high-Z material and the low-Z material in the sample) may be determined.

Tantalum marker 12 of the present embodiments is a high-Z material with an atomic number 73. In contrast, the substrate 10 (also referred to as a wafer) may be made of a low-Z material. For example, the substrate 10 may be made of Si or SiGe, but embodiments of the present disclosure are not limited thereto. For example, substrate 10 may be made of any suitable material, so long as the alignment marker 12 positioned on the substrate 10 may be suitably detected by the marker detection equipment 14. According to one or more embodiments, the Ta marker 12 may be detected on the substrate 10 using the marker detection equipment 14 such as the backscattered electron detector. For example, the marker detection equipment 14 may determine the position of an edge of the Ta marker 12 on the substrate 10. From the position of the marker edge, the marker detection equipment 14 may then calculate the center of the marker 12, and thus determine the location of the marker 12.

Figure 7A:
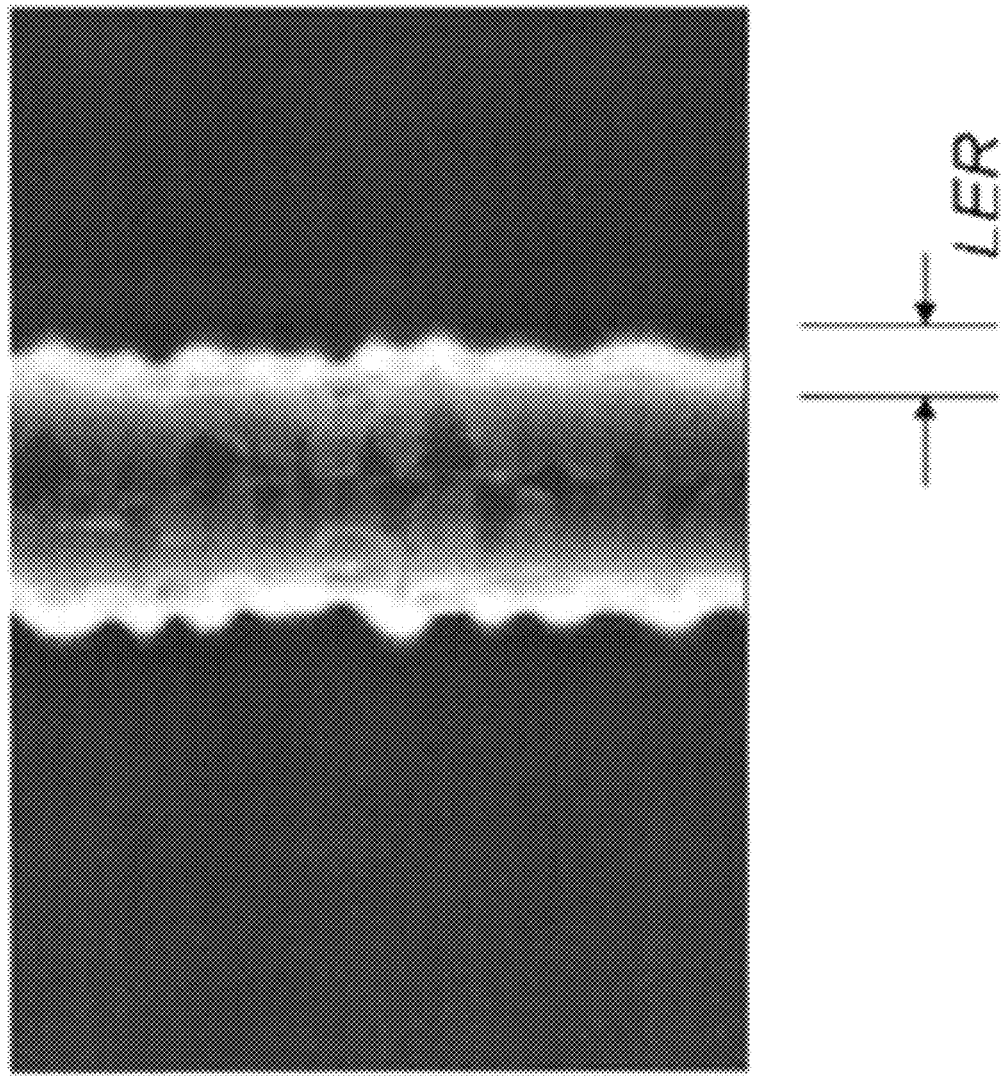
FIG. 7A is an SEM photograph of an example material with line edge roughness (LER).

Because the location of the marker 12 is determined based on marker edge detection, it is important for the marker detection equipment 14 to be able to accurately determine the marker edge. For example, line edge roughness (LER) of a marker may reduce the accuracy with which the marker detection equipment 14 can determine the location of the marker edge. Line edge roughness occurs when edges of a feature are not straight lines, but are instead uneven. For example, FIG. 7A illustrates an example LER of a material. LER can be calculated based on the deviation of the feature edges from the mean straight line, and is usually characterized as the 35 deviation of a line edge from a straight line, as described in more detail in http://lithoguru.com/scientist/litho_tutor/Tutor62%20(Aug%2008).pdf, the entire contents of which are incorporated herein by reference.

According to one or more embodiments of the present disclosure, the Ta alignment marker 12 of the present embodiments may have LER of less than 2.5 nm. When the LER of the Ta marker 12 is below 2.5 nm, the BSD can suitably determine the marker edge, and thus the accuracy of alignment of the multi-level integrated circuit structure may be improved.

Figure 7B:
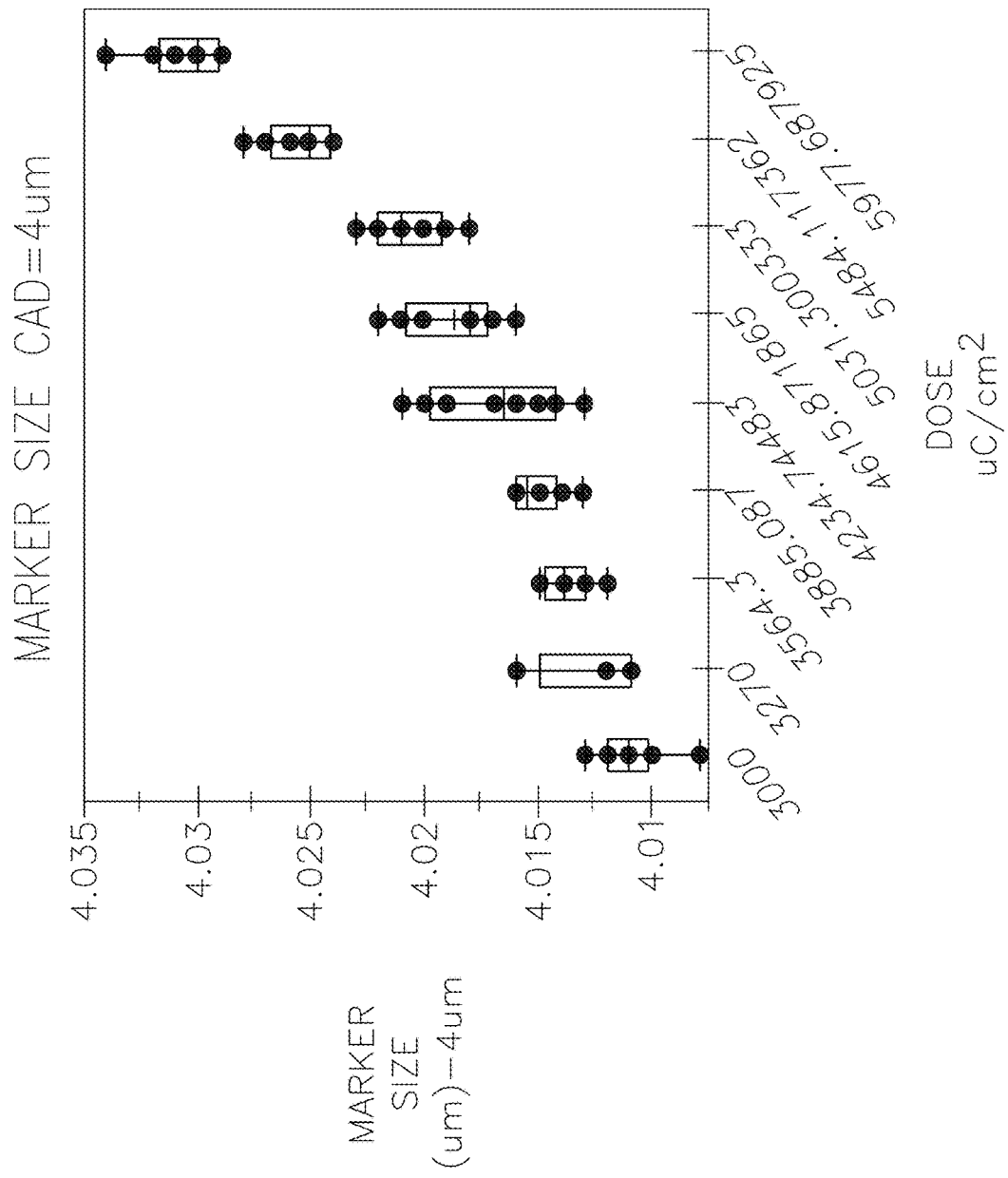
FIG. 7B is a graph showing change in Ta marker size relative to marker e-beam dose.
Figure 7C:
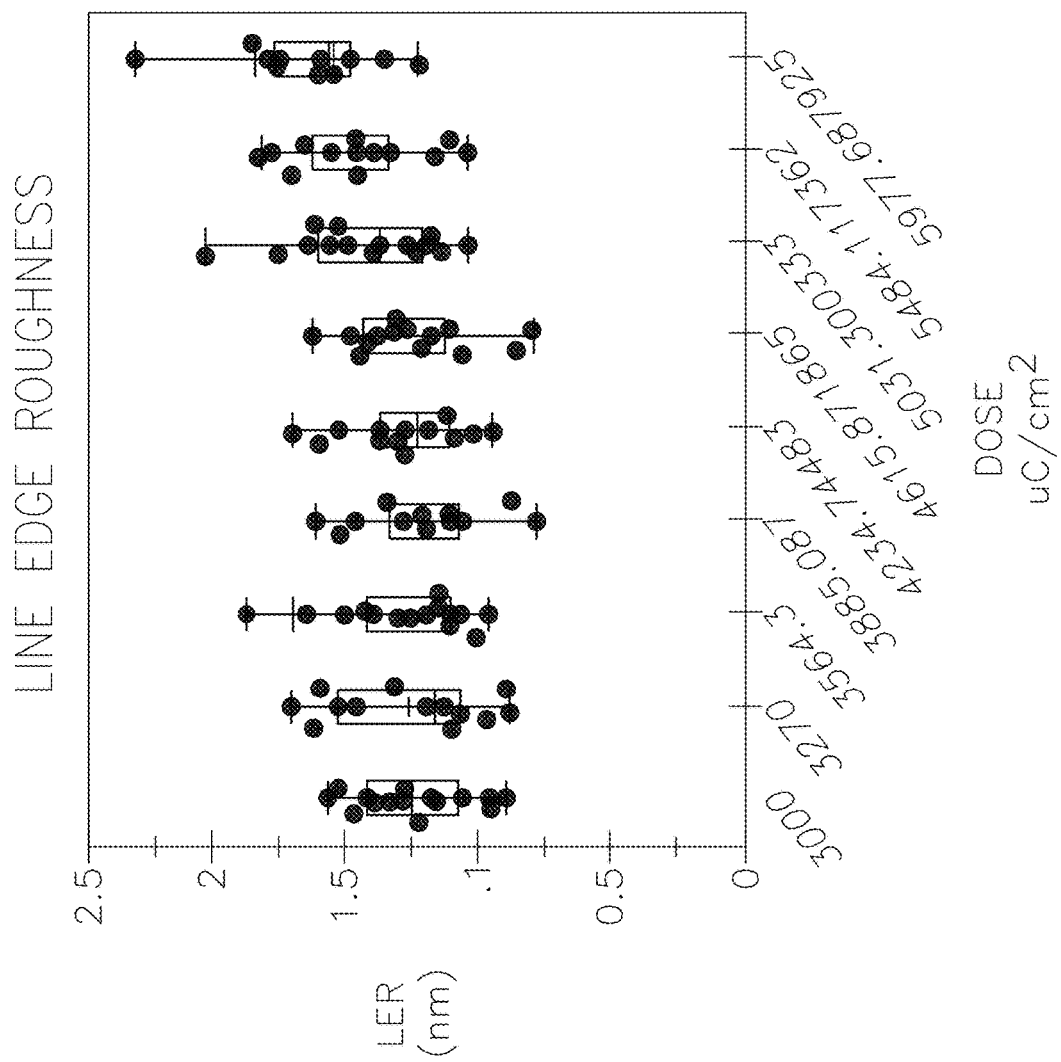
FIG. 7C is a graph showing change in Ta marker LER relative to marker dose.

According to one or more embodiments, LER of the Ta maker 12 may remain substantially unchanged, even with increased marker dose, which refers to the number of electrons per unit area applied by the electron beam of an e-beam lithography system to the e-beam resist used to pattern the alignment marker 12. As shown in FIG. 7B, as the dose of the deposited Ta marker is increased, the size of the marker also increases. For example, as the marker dose increases from 3000 uC/cm$^2$ to slightly under 6000 uC/cm$^2$, marker size may increase from about 4 um to about 4.035 um. However, as shown in FIG. 7C, the LER of the Ta marker of the present embodiments may remain substantially the same, even as the marker dose increases. For example, as the marker dose increases from 3000 uC/cm$^2$ to slightly under 6000 uC/cm$^2$, LER of the marker remains under 2.5 nm. According to one or more embodiments, LER of the Ta marker 12 may be in a range from about 0.75 nm to about 2.25 nm. According to one or more embodiments, a median LER of the Ta marker 12 may be about 1.25 nm. When the LER of the Ta marker 12 of the present embodiments is less than 2.5 nm, the marker detection equipment 14 including the BSD may determine the marker edge with suitable accuracy, and thus the alignment of the multi-level integrated circuit structure may be improved.

According to one or more embodiments, when the Ta marker 12 is utilized in multi-level e-beam lithography according to the method of the present embodiments, alignment resolution of less than about 5 nm may be achieved. In other words, the resulting structure (e.g., an integrated circuit, a semiconductor device, etc.) can have misalignment of less than about 5 nm. When the device structure has a misalignment of less than about 5 nm, improved performance of the device may be achieved.

During the fabrication of integrated circuits, such as, for example, complementary metal-oxide-semiconductor (CMOS) integrated circuits, the substrate 10 may undergo various cleaning and polishing processes. For example, during FEOL process steps of manufacturing CMOS integrated circuits, the substrate 10 may be subjected to wet clean steps, such as standard clean 1 (SC-1) step and/or standard clean 2 (SC-2) step. During SC-1 and/or SC-2 wet cleans, suitable acidic solutions and/or basic solutions may be utilized. For example, SC-1 and/or SC-2 wet cleans may utilize hydrogen peroxide ($H_2O_2$) solution. In one or more embodiments, the substrate 10 may also be subjected to chemical-mechanical planarization (CMP), which uses a combination of corrosive chemicals and a polishing pad to even out any irregular topography on the surface of the substrate 10. In one or more embodiments, processes such as hydrofluoric acid (HF) dips and/or thermal annealing may be further performed on the substrate 10. According to one of more embodiments, any of the above-described processes can also be performed on one or more layers 20 formed on the substrate 10.

According to one or more embodiments, the Ta alignment marker 12 of the present embodiments may exhibit excellent resistance to wet etching in acidic and basic solutions (e.g., wet cleaning using acidic and basic solutions), as compared with related high-Z alignment markers. For example, the Ta alignment marker 12 of the present embodiments may not be etched (e.g., may not be substantially etched) in hydrogen peroxide ($H_2O_2$), while a comparable tungsten (W) alignment marker may be entirely (or almost entirely) removed by hydrogen peroxide. As discussed above, hydrogen peroxide may be used in SC-1 and/or SC-2 wet cleans during the manufacturing of CMOS integrated circuits.

Figure 8B:
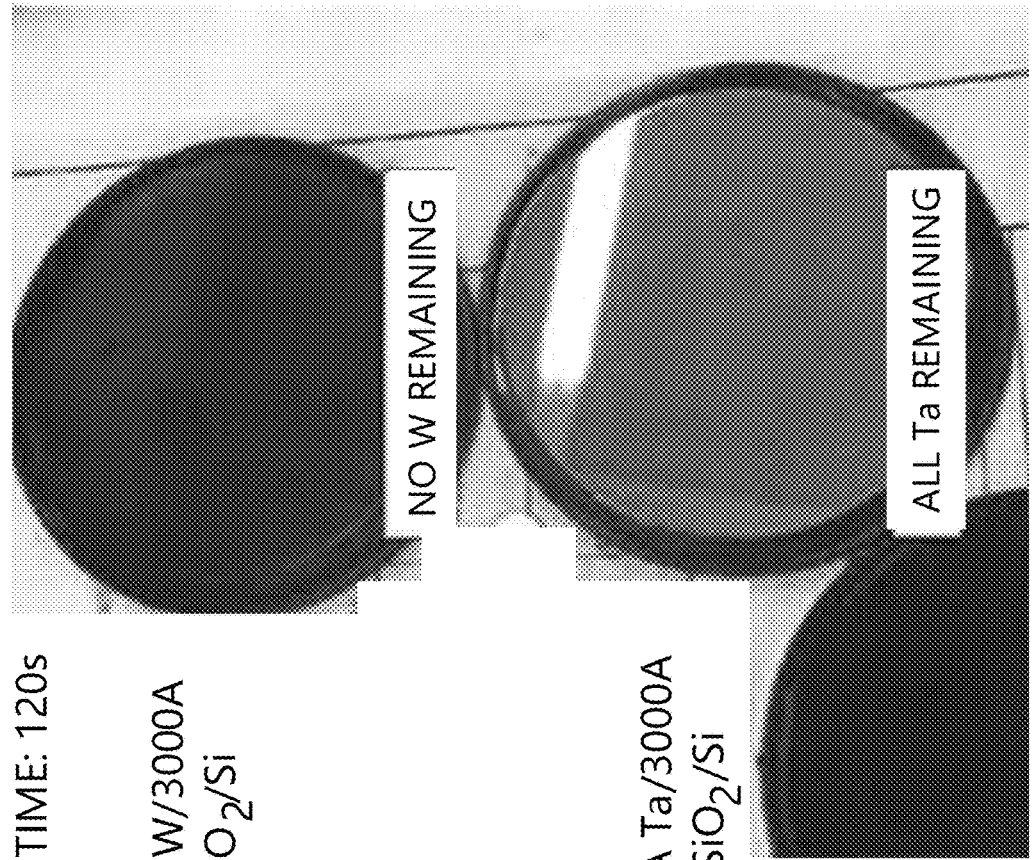
FIG. 8B illustrates photographs of a Ta sample and a W sample, each after being in a 30% $H_2O_2$ solution for 120 seconds.

FIGS. 8A and 8B illustrate wet etch characteristics of tantalum (Ta) and tungsten (W) in a (30%) hydrogen peroxide ($H_2O_2$) solution. FIG. 8A is a graph showing thickness change over time of a Ta sample and a W sample, each submerged in (30%) $H_2O_2$. The starting thicknesses of both the Ta sample and the W sample were about 250 Å each. As can be seen from FIG. 8A, the Ta sample remained substantially unetched (e.g., the thickness of the Ta sample remained substantially the same) after being in the $H_2O_2$ solution for 300 seconds, while the W sample was completed etched. FIG. 8B illustrates photographs of a Ta sample and a W sample after being in a 30% $H_2O_2$ solution for 120 seconds. Initial thickness of each sample was 250 Å, and the samples were on a 3000 Å-thick $SiO_2$/Si wafer. As can be seen from FIG. 8B, substantially no material remained in the W sample (W was completely etched), while substantially all material remained in the Ta sample (Ta was not etched).

According to one or more embodiments, the Ta marker 12 may exhibit resistance to wet cleans, such as wet cleans with hydrogen peroxide, that are used in CMOS manufacturing. According to one or more embodiments, the Ta marker 12 may exhibit stability in various electrochemical environments. As such, edges of the Ta marker 12 may suffer from significantly less defects (such as, for example, etch pits) than a comparable tungsten (W) marker. Accordingly, the Ta marker 12 may exhibit excellent LER throughout the entire process flow for manufacturing integrated circuits, and thus improved alignment of the fabricated structure may be achieved.

According to one or more embodiments, the alignment marker 12 may maintain excellent adhesion to the underlying substrate 10. For example, the material for the alignment marker 12 (e.g., metal tantalum (Ta)) may display a negative enthalpy of formation of oxides (e.g., $Ta_2O_5$) and nitrides (e.g. TaN). When a marker material is embedded in (e.g., deposited in) a substrate, an oxide and/or nitride of the marker material may be formed when the substrate is exposed to outside air. For example, the substrate may be made of a silicon-containing material, but embodiments of the present disclosure are not limited thereto. For example, the marker may be formed of a suitable metal material. The oxide and/or nitride of a metallic marker material may be formed at the bottom of the deposited marker material. For example, a metal oxide and/or metal nitride may be formed underneath the metal marker material, between the substrate material and the remaining metal marker material.

According to one or more embodiments, when the Ta marker 12 is embedded in the substrate 10, tantalum oxide (e.g., $Ta_2O_5$ or $Ta_2O_3$) and/or tantalum nitride (e.g. TaN) may be formed, and thus the marker 12 may retain suitable adhesion to the underlying substrate 10. According to one or more embodiments, the Ta marker 12 of the present embodiments may exhibit excellent (or suitable) adhesion to a variety of substrates 10, due to negative enthalpy of formation of tantalum oxides and tantalum nitrides. Moreover, in one or more embodiments, the tantalum oxide (e.g., $Ta_2O_5$ or $Ta_2O_3$) and/or the tantalum nitride (e.g. TaN) that forms at the interface between the Ta marker 12 and the substrate 10 is less vulnerable to undercut during a subsequent wet clean process than $SiO_2$ utilized in conventional processes to promote adhesion because the tantalum oxide (e.g., $Ta_2O_5$ or $Ta_2O_3$) and/or the tantalum nitride (e.g. TaN) that naturally forms is typically thinner than the $SiO_2$ deposited in conventional processes. Accordingly, in one or more embodiments, the present disclosure does not include a task of depositing a layer of $SiO_2$ to promote adhesion between the Ta marker 12 and the substrate 10. As a result, accuracy of marker edge detection by the marker detection equipment 14 may be improved, and accuracy of alignment during multi-level e-beam lithography process may be improved.

According to one or more embodiments, the alignment marker 12 including 73Ta may improve alignment accuracy during multi-level e-beam lithography. For example, the alignment marker 12 may improve alignment accuracy during act 103 of patterning one or more layers 20 on the substrate 10 based on the location of the alignment marker 12. Various cross-sectional images of transistor devices formed according to embodiments of the present disclosure confirm that an alignment accuracy of approximately 5 nm or less between a gate level and a via level of the device is achievable. According to one or more embodiments, the alignment marker 12 may improve layer-to-layer alignment during multi-level e-beam lithography.

While the fabrication of integrated circuits has been described herein as an example, embodiments of the present disclosure are not limited thereto. For example, the alignment marker 12 of the present embodiments may be utilized for any device fabrication process that uses multi-level e-beam lithography, including, without limitation, manufacturing of devices for applications in quantum electronics, quantum optics, quantum memory, etc.

According to one or more embodiments of the present disclosure, the alignment marker 12 including tantalum (Ta) may have LER of less than 2.5 nm, and may maintain this LER even with increasing marker dose. Accordingly, marker edge of the alignment marker 12 may be substantially straight, and thus may be detected by the marker detection equipment 14 (such as, for example, a backscattered electron detector) with improved accuracy. As a result, the location of the marker 12 may be determined with improved accuracy and overall alignment of the structure being manufactured may be improved. According to one or more embodiments, the resulting structure may be formed with an alignment resolution of less than 5 nm (e.g., with misalignment of less than 5 nm). According to one or more embodiments, the alignment marker 12 may be utilized in the fabrication of multi-level nano-scale devices. For example, the alignment marker 12 may be utilized in the fabrication of multi-level devices with pitches of less than 100 nm. For example, the alignment marker 12 may be utilized in the fabrication of integrated circuits, during FEOL and/or back-end-of-line (BEOL) process steps. According to one or more embodiments, the alignment marker 12 including $_{73}$Ta may improve alignment accuracy during multi-level e-beam lithography.

Figure 9:
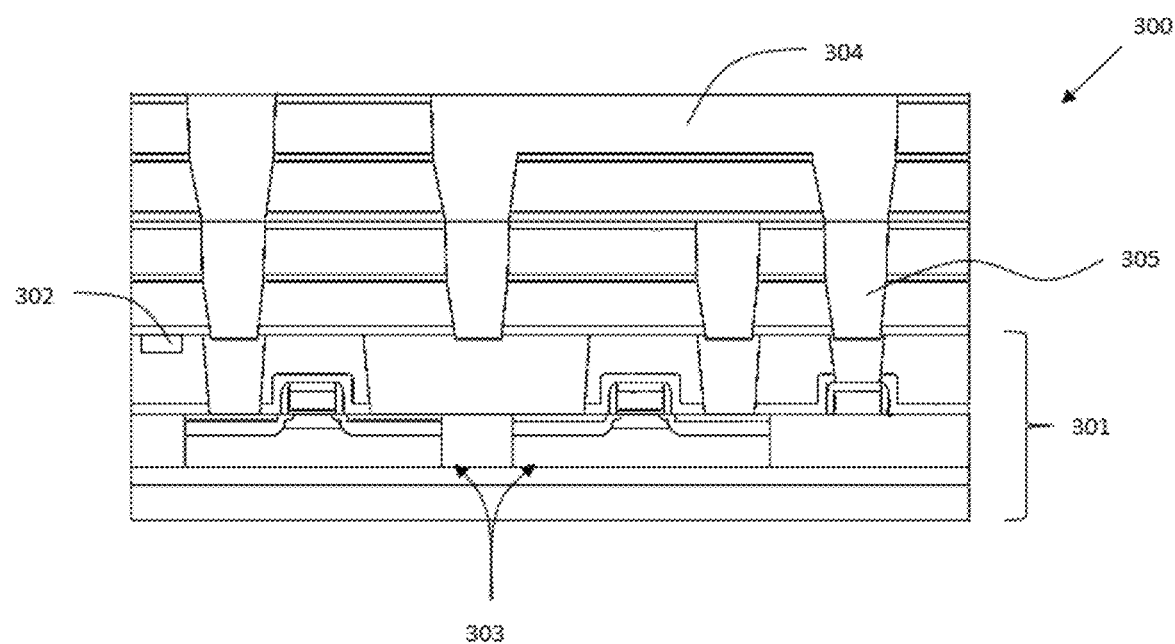
FIG. 9 is a schematic view of a semiconductor device including an alignment marker according to one embodiment of the present disclosure.

FIG. 9 is a schematic view of a semiconductor device 300 according to one embodiment of the present disclosure. In the illustrated embodiment, the semiconductor device 300 includes a substrate 301 including at least one tantalum (Ta) alignment marker 302 formed therein, and a series of transistors 303 in the substrate 301. The transistors 303 may be configured into any suitable type or kind of logic devices (e.g., an inverter, a NAND gate, a NOR gate, a flip flop, or other logic circuits). The configuration of the Ta alignment marker 302 may be the same as or similar to the alignment marker 12 described above. Additionally, in the illustrated embodiment, the semiconductor device 300 also includes a series of metal interconnects 304 and vias 305 interconnecting the transistors 303 (e.g., to supply power from power rails to the transistors 303 and to transfer output signals from the transistors 303).

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims. Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

What is claimed is:

1. A method of fabricating a semiconductor device, the method comprising:
    forming an alignment marker in a substrate, the alignment marker comprising tantalum, wherein the edge of the alignment marker has a line edge roughness of about 2.5 nm or less;
    determining, utilizing a backscatter electron detector of an electron beam lithography tool, a location of an edge of the alignment marker based on an atomic number contrast between the alignment marker and the substrate; and
    forming, utilizing the electron beam lithography tool, at least one transistor in the substrate based on the location of the edge of the alignment marker.

2. The method of claim 1, wherein the alignment marker has a line edge roughness in a range from about 0.75 nm to about 2.25 nm.

3. The method of claim 1, further comprising wet etching the substrate, wherein the alignment marker is substantially not etched during the wet etching of the substrate.

4. The method of claim 3, wherein the wet etching of the substrate utilizes $H_2O_2$.

5. The method of claim 1, wherein the forming the alignment marker comprises:
    forming a trench in the substrate;
    depositing an alignment marker material comprising metal tantalum (Ta) in the trench; and
    patterning the deposited alignment marker material to form the alignment marker,
    wherein a height of the alignment marker in a thickness direction of the substrate is less than or equal to a depth of the trench in the thickness direction of the substrate.

6. The method of claim 5, wherein the patterning of the deposited alignment marker material comprises dry etching the deposited alignment marker material utilizing a fluorinated plasma and a mask, and wherein the deposited alignment marker material has a selectivity to the mask in the fluorinated plasma of greater than about 16:1.

7. The method of claim 6, wherein:
    the fluorinated plasma comprises $CF_4$, and
    the mask comprises a hafnium oxide ($HfO_2$) mask.

8. The method of claim 5, wherein, during the depositing of the alignment marker material, a reaction between the alignment marker material and a material of the substrate exhibits a negative enthalpy of formation.

9. The method of claim 8, wherein the material of the substrate is selected from the group consisting of oxide, nitride, and carbide.

10. The method of claim 1, further comprising determining a centroid of the alignment marker based on the location of the edge of the alignment marker, and wherein the forming, utilizing the electron beam lithography tool, the at least one transistor in the substrate is further based on the centroid of the alignment marker.

11. The method of claim 1, further comprising performing at least one back-end-of-line process on the substrate, and wherein the performing the at least one back-end-of-line process comprises forming at least one metal interconnect and/or at least one via based on the location of the edge of the alignment marker.

12. A method of forming an alignment marker in a substrate, the method comprising:
- forming a trench in the substrate;
- depositing an alignment marker material comprising metal tantalum (Ta) in the trench; and
- patterning the deposited alignment marker material to form the alignment marker,
- wherein a height of the alignment marker in a thickness direction of the substrate is less than or equal to a depth of the trench in the thickness direction of the substrate, and
- wherein the edge of the alignment marker has a line edge roughness of about 2.5 nm or less.

13. The method of claim 12, wherein the patterning of the deposited alignment marker material comprises dry etching the deposited alignment marker material utilizing $CF_4$ and a hafnium oxide ($HfO_2$) mask, and wherein the deposited alignment marker material has a selectivity to the $HfO_2$ mask in a $CF_4$ plasma of greater than about 16:1.

14. The method of claim 12, wherein the substrate comprises a material selected from the group consisting of oxide, nitride, and carbide, and wherein, during the depositing of the alignment marker material in the trench of the substrate, a reaction between the alignment marker material and the material of the substrate exhibits a negative enthalpy of formation.

* * * * *